United States Patent [19]
Gindrup

[11] 4,453,140
[45] Jun. 5, 1984

[54] OSCILLATOR USING CHARGE-DISCHARGE CHARACTERISTICS OF A TRANSISTOR JUNCTION

[76] Inventor: Wayne L. Gindrup, 1019 12th St. Dr., SW., Hickory, N.C. 28601

[21] Appl. No.: 322,453

[22] Filed: Nov. 18, 1981

[51] Int. Cl.³ .................... H03K 3/282; H05B 39/09
[52] U.S. Cl. .................... 331/111; 315/200 A; 340/81 R; 340/331
[58] Field of Search .................... 331/111, 113 R; 315/200 A, 209 R; 340/81 R, 331

[56] References Cited

U.S. PATENT DOCUMENTS

| | | | |
|---|---|---|---|
| 2,991,429 | 7/1961 | Force | 331/111 |
| 3,018,473 | 1/1962 | Rodgers | 331/111 X |
| 3,022,467 | 2/1962 | Leeder, Jr. | 331/113 R X |
| 3,382,405 | 5/1968 | Johnson | 331/111 X |
| 3,478,248 | 11/1969 | Ivec | 331/113 R X |

*Primary Examiner*—Siegfried H. Grimm
*Attorney, Agent, or Firm*—Bell, Seltzer, Park & Gibson

[57] ABSTRACT

A transistor oscillator circuit having a cascaded pair of transistors connected with the collector terminal of one transistor in an inverted electrical polarity so that the oscillatory period is determined by the time required for discharging a charge stored across one junction of one transistor.

4 Claims, 2 Drawing Figures

OSCILLATOR USING CHARGE-DISCHARGE CHARACTERISTICS OF A TRANSISTOR JUNCTION

FIELD AND BACKGROUND OF INVENTION

This invention relates to a transistor oscillator circuit.

Standard reference texts directed to the design and application of transistor circuitry include discussion of the design, construction and operation of transistor oscillators. As stated in certain such texts, the simpliest form of oscillator is an amplifier which furnishes its own input signal from its own output signal. The process of oscillation simply involves the connection of output to input so that certain conditions, known as stability criteria, are fulfilled. One manner of representing transistor oscillator circuits employs a representation of a first amplifier having an input, an output, and a stated gain. A second amplifier, having an input, an output and a stated gain, is connected to provide a feedback path about the first amplifier. That is, the input of the second amplifier is connected to the output of the first amplifier, with the output of the second amplifier being an input to the first. In such an analysis, at least five common approaches are used for an analytical determination of the stability of the system and, inasmuch as they are well known, need not be stated in detail here.

Transistor oscillator circuits constructed in accordance with the generally applied principles described in the standard reference texts have achieved usefulness in a wide variety of applications. In at least certain applications, power consumption over time as the oscillator circuit operates is of significance and importance. This is particularly so in battery powered circuits intended for operation over extended intervals of time, but represents a factor in a large number of other applications. In battery powered applications of the type described, one significant application is in controlling flashing of a lamp or other indicator. As will be appreciated, power consumed in operating a flashing lamp and the like is a significant factor in a number of applications.

BRIEF DESCRIPTION OF INVENTION

With the aforementioned desired characteristics of transistor oscillator circuits particularly in mind, it is an object of the present invention to provide a transistor oscillator circuit capable of operating at decreased levels of power consumption. In realizing this object of the present invention, the oscillatory period of a transistor oscillator circuit is determined by the charge-discharge characteristics of the junction of one transistor employed in the oscillator circuit. More particularly, the oscillator circuit uses a first transistor for controlling electrical current flow through a load and a second transistor for controlling electrical current flow through the first transistor. One of the transistors has the collector thereof connected in inverted electrical polarity, as defined hereinafter, so that operation in accordance with the present invention is achieved.

Yet a further object of the present invention is to operate a transistor oscillator circuit in accordance with a method in which the oscillatory cycle is determined by the leakage charge characteristics of a transistor. In realizing this object of the present invention, the diode junction characteristics internally within a transistor are employed to determine the oscillatory operation thereof, as described more fully hereinafter.

BRIEF DESCRIPTION OF FIGURES

Some of the objects of the invention having been stated, other objects will appear as the description proceeds, when taken in connection with the accompanying drawings, in which.

DETAILED DESCRIPTION OF INVENTION

Figure 1:
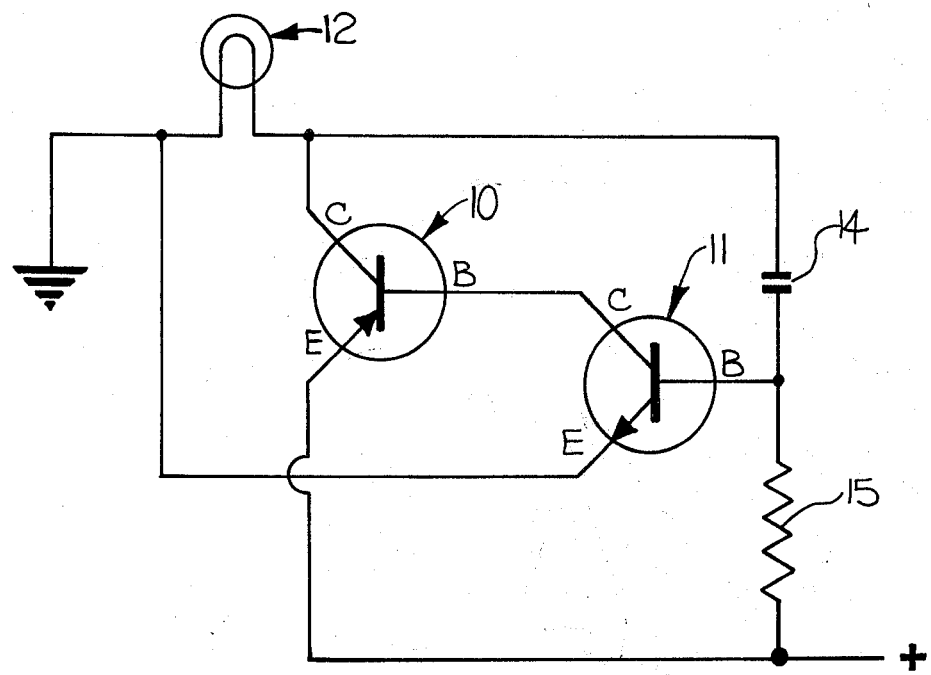
FIG. 1 is a schematic representation of a transistor oscillator circuit in accordance with prior disclosures.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

For purposes of clarifying the present invention, it is deemed appropriate to first review the operation of a transistor oscillator circuit of a previously known type and with which the circuit of the present invention shares certain characteristics. For that purpose, a two transistor circuit (FIG. 1) used to control the flashing of an incandescent lamp and powered by an appropriate battery source has been chosen. It is to be understood at the outset of the description which follows that the specific circuit chosen, shown and described has been selected for illustrative purposes only and is representative of a number of other circuit arrangements. The circuit of FIG. 1 employs a cascaded pair of transistors 10, 11. Each transistor has terminals connected to a collector as identified by the capital letter C, a base as identified by the capital letter B, and an emitter as identified by the capital letter E. In the form illustrated, one transistor 10 is of the type known as PNP, while the other transistor 11 is of the type known as NPN. The circuit further includes a load in the form of an incandescent lamp 12, a capacitor 14, and a resistor 15. An appropriate electrical current is applied to one terminal of the resistor 15 and to the emitter of the first transistor 10, with the emitter of the second transistor 11 and one terminal of the lamp 12 being grounded to complete the circuit through the oscillator circuit and load.

One explanation for the operation of the circuit of the prior art, as shown in FIG. 1, is that the first transistor 10 is used as a switch. Referring to electron flow, when the first transistor T1 becomes conductive or "turns on," electrons flow from the ground through the lamp 12 into the collector C of the first transistor 10 and flow out of the first transistor 10 via the emitter E to the positive connection. In order for the first transistor 10 to become conductive as described, electrons must be injected into the base B. Such an electron flow is provided by the operation of the second transistor 11, which is connected in a manner herein called a normal electrical polarity.

In order for the second transistor 11 to supply electrons through the collector C to the base B of the first transistor 10, the second transistor 11 must become conductive or "turn on." The second transistor 11 will become conductive with a flow of electrons from the ground or negative terminal through the emitter E of the second transistor 11 and then by way of the base B through the resistor 15 to the positive connection. The second transistor 11 will remain conductive or "turned on" for so long as electrons can flow from the emitter to the base.

With the circuit of FIG. 1 as described to this point, the initial application of power will result in electrons flowing through the load provided by the lamp 12 and through the capacitor 14 to the base B of the second transistor 11, biasing the base negative and holding the second transistor 11 "turned off" or nonconductive. The resistor 15 permits a flow of electrons from the base B of the second transistor 11 to the positive connection, causing the capacitor 14 to "charge" or accumulate a differential thereacross. As a result, the base B of the second transistor 11 slowly becomes less negative. As such occurs, electron flow from ground into the emitter E of the second transistor 11 and out through the base B thereof begins, "turning on" the second transistor 11 and in turn "turning on" the first transistor 10.

Upon the first transistor 10 becoming conductive, the charge on the capacitor 14 is discharged or dissipated through the collector C and emitter E of the first transistor 10. At the same time, electrons flow through the load lamp 12, causing the lamp to be illuminated. At that interval of time, electrical current is flowing through all of the first transistor 10, the second transistor 11, and the load 12.

In such a circumstance, electrons are still flowing from the emitter E of the second transistor 11 to the base B at a rate above the rate possible through the impedance represented by the resistor 15, causing the base B of the second transistor 11 to become more negative and the capacitor 14 to accumulate a charge opposite to its previous polarity. The base B of the second transistor 11 soon will become sufficiently negative that electrons cease to flow through the junction between the emitter and base, causing the second transistor 11 to become nonconductive. Upon conduction through the second transistor 11 ceasing, the first transistor 10 also ceases to conduct. Upon cessation of conduction through the transistors 10, 11, electrons continue to flow through the load lamp 12 to charge the capacitor 14, until such time as the capacitor attains an equal potential thereacross. When the capacitor attains a state of equal potential, electron flow through the load lamp 12 ceases and the circuit returns to the original state. One typical circuit of the type described to this point might cause a typical incandescent lamp, such as a number 48 lamp, to be illuminated for an interval of time in the range of from about 80 to about 100 milliseconds. Such a circuit has demonstrated a certain tendency to "latch" with both transistors conducting in a saturated state and with the lamp illuminated. The prior art circuit described to this point will be understood by persons of appropriate skill in the applicable arts, as will the normal operation of that circuit.

Figure 2:
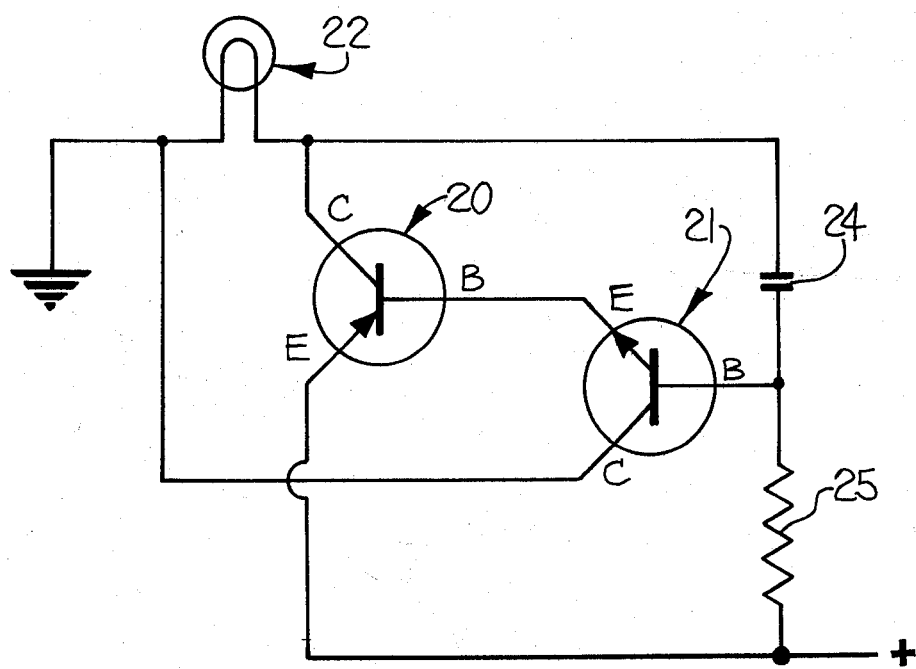
FIG. 2 is a schematic representation similar to FIG. 1 and showing a transistor oscillator circuit operating in accordance with the present invention.

Referring now more particularly to the present invention, as illustrated by FIG. 2, the transistor oscillator circuit of this invention is distinctive in relying upon certain characteristics of a semiconductor junction as is incorporated within a transistor. More particularly, a semiconductor junction will conduct in a reverse bias direction for a relatively short interval of time dependent upon the removal of an accumulated stored charge. The stored charge typically is quite small, resulting in a typically short conduction time. However, such a short conduction time contributes to important characteristics of the transistor oscillator circuit and operation of the present invention. Particularly in a lamp flasher application, it is preferred that the oscillatory cycle provide a current pulse which is relatively short and of relatively great intensity. Due to the nature of an incandescent lamp, battery drain is lessened as the time duration of the pulse is decreased. The lower limit of time duration would be reached when the lamp is not able to respond to the pulse and create a flash. A typical incandescent lamp rated at 1½ volts and 15 to 30 milliamp current requires a pulse on the order of 20 milliseconds. Experience with circuits of the present invention, as illustrated in FIG. 2 and described more fully hereinafter, indicates that such pulse timing is a relatively normal consequence of reverse bias direction conduction through a semiconductor junction.

Referring now more particularly to the transistor oscillator circuit of FIG. 2, components of that circuit corresponding generally to the circuit of FIG. 1 have been given comparable reference characters, of the twenties order of magnitude. Thus, the circuit of FIG. 2 has a first transistor 20, and a second transistor 21. As will be noted, the transistor oscillator circuit in accordance with the present invention has the first and second transistors 20, 21 arranged as a cascaded pair. Each of the transistors 20, 21 has an emitter terminal E, a collector C, and a base terminal B. The first transistor 20 has the base B thereof connected directly to the emitter E of the second transistor 21. In accordance with an important distinguishing characteristic of the present invention, the second transistor 21 is connected in an inverted electrical polarity. That is, as will be noted by a comparison of FIGS. 1 and 2, the second transistor 11 is connected in what is an accepted normal electrical polarity, with the collector terminal C connected with the base terminal B of the first transistor 10. By way of distinction, the second transistor 21 of the circuit of the present invention (FIG. 2), while also being of an NPN type, is connected in the reverse of the usual and obvious manner.

In view of the availability of a number of standard reference works which describe the relationship among the two junctions which define a conventional semiconductor transistor, it is not felt necessary to set forth at length the details of solid state electrical theory or transistor construction. It is deemed sufficient for present purposes to note that all transistors are constructed in such a manner that a small current flow through the base causes a large current flow between the emitter and collector, when the transistor is correctly biased. In the case of an NPN transistor such as the second transistor 21 in the circuit of the present invention, the construction of the junctions forming the transistor is such that a small flow of electrons from the emitter E to the base B will bring about a large flow of electrons from the emitter E to the collector C. The impurity concentrations lending N and P type characteristics to the semiconductor material, and the gradients of such impurities near the junctions, render it virtually impossible for electrons to flow from the collector to the base in such a manner that electrons can diffuse across the base region to the emitter.

At first consideration, it may well appear that the circuit of the present invention would not operate, due to a need to introduce electrons into the base B of the first transistor 20 in order to cause the first transistor 20 to become conductive or "turn on". Theoretically, for such an occurrence, electrons must flow in the second transistor 21 from the collector across the base junction and to the emitter, and thence to the base of the first transistor 20. Usual theory suggests that any attempted movement of electrons in the second transistor 21 from the base into the emitter would impose a reverse bias on an PN junction, which would stop the electron flow.

The reverse biasing of a PN junction does not, in fact, follow theory in full detail, inasmuch as the junction will conduct for a very brief interval of time until the stored charge across the junction is removed, after which conduction through the junction will stop. It is this phenomenon which is relied upon by the transistor oscillator circuit of the present invention.

Describing now the operation of the circuit of FIG. 2 in a manner parallel to that set out hereinabove with respect to FIG. 1, it is assumed that, at the moment power is applied, the first and second transistors 20, 21 are nonconductive and the load lamp 22 has no current flow therethrough. With the application of power, electrons flow from the ground through the load lamp 22, and through the capacitor 24 to the base B of the second transistor 21. The base B thus becomes negative, and electrons therefore cannot flow from the collector of the second transistor 21 to the base. At the same time, electrons will slowly bleed from the base of the second transistor 21 through the resistor 25, causing the base to become less negative. At some point in time, electrons will begin to flow from the collector C to the base B. Upon such an occurrence, the base-emitter PN junction becomes reversed biased and, for a short instant in time, the electrons and holes around that junction move to create a reversed bias condition under which no current flows. This movement of charges, to cause a depleted N junction, constitutes a brief flow of electrons from the emitter E of the second transistor 21 to the base B of the first transistor 20. The brief electron flow causes the first transistor 20 to become conductive, or "turn on," causing conduction through the load lamp 22 and discharge of the capacitor 24. At such time, electrons in the circuit in accordance with this invention are not flowing into the base of the first transistor 20 due to the PN junction of the second transistor 21 having become reversed biased in such a manner as to interrupt or stop the electron flow into the base of the first transistor 20.

By way of contrast, the circuit of the prior art (FIG. 1) operated with the load lamp 12 being illuminated and with both the first and second transistors 10, 11 conducting and in saturation. In the circuit in accordance with the present invention (FIG. 2), the load lamp 22 is illuminated, the first transistor 20 is conductive, but the second transistor 21 is nonconductive insofar as the first transistor 20 is concerned. This result follows because electrons are not, at that time, flowing from the emitter of the second transistor 21 to the base of the first transistor 20, even through electrons may be flowing from the collector of the second transistor 21 to the base thereof. Upon the first transistor 20 becoming conductive, electrons left on the base-emitter Pn junction of the second transistor 21 which had become reversed biased flow through the capacitor 24 and through the first transistor 20 to the positive connection, restoring the PN junction to a neutral state and allowing electrons and holes to again diffuse into the region around the junction.

In the drawings and specification there has been set forth a preferred embodiment of the invention and although specific terms have been employed, they are used in a generic and descriptive sense only and not for purposes of limitation.

That which is claimed is:

1. A transistor oscillator circuit comprising
   (a) a voltage source having first and grounded terminals;
   (b) a load having one terminal grounded;
   (c) a first transistor of a first semiconductor type having a collector, emitter and base, said collector electrode being connected to the ungrounded load terminal, said emitter electrode being connected to the first terminal of said voltage source;
   (d) a second transistor of the opposite semiconductor type having a collector, emitter and base, said collector electrode being grounded, and said emitter electrode being connected to the base electrode of said first transistor;
   (e) a resistor having one terminal connected to the first terminal of said voltage source and a second terminal connected to the base electrode of said second transistor; and
   (f) a capacitor having one terminal connected to the collector electrode of said first transistor and a second terminal connected to the base electrode of said second transistor, whereby the duty cycle of the load depends at least in part upon the charge-discharge characteristics of a transistor junction.

2. The transistor oscillator circuit according to claim 1 wherein said first transistor comprises a PNP type and said second transistor comprises an NPN type.

3. A transistor oscillator circuit according to claim 1 wherein said first transistor comprises an NPN type and said second transistor comprises a PNP type.

4. A transistor oscillator circuit according to claim 1, wherein said load comprises a lamp.

* * * * *